(12) United States Patent
Honda et al.

(10) Patent No.: US 6,710,653 B2
(45) Date of Patent: Mar. 23, 2004

(54) D-CLASS POWER AMPLIFIER WITH ELECTRIC POWER REGENERATION FUNCTION

(75) Inventors: Jun Honda, Tokorozawa (JP); Tsutomu Kawamoto, Tokorozawa (JP)

(73) Assignee: Pioneer Corporation, Tokyo (JP)

(*) Notice: Subject to any disclaimer, the term of this patent is extended or adjusted under 35 U.S.C. 154(b) by 9 days.

(21) Appl. No.: 10/146,131

(22) Filed: May 16, 2002

(65) Prior Publication Data

US 2002/0180524 A1 Dec. 5, 2002

(30) Foreign Application Priority Data

May 17, 2001 (JP) ........................................ 2001-147851

(51) Int. Cl.⁷ ............................................... H03F 3/217
(52) U.S. Cl. .................... 330/207 A; 330/251; 330/304
(58) Field of Search .................. 330/10, 207 A, 330/251, 304; 381/120

(56) References Cited

U.S. PATENT DOCUMENTS

| | | | |
|---|---|---|---|
| 4,179,669 A | 12/1979 | Dodson et al. | 330/282 |
| 5,117,198 A | 5/1992 | Morenz | 330/251 |
| 5,243,656 A | 9/1993 | Tanida et al. | 381/24 |
| 6,016,075 A * | 1/2000 | Hamo | 330/10 |
| 6,169,681 B1 | 1/2001 | Kemp, III et al. | 363/98 |
| 6,181,796 B1 | 1/2001 | Johnson | 381/28 |

* cited by examiner

*Primary Examiner*—Steven J. Mottola
(74) *Attorney, Agent, or Firm*—McGinn & Gibb, PLLC

(57) ABSTRACT

A D-class power amplifier of two channels in which an increase in power voltage due to a regenerative current is prevented and a high efficiency in utilization of electric power is attained. Two D-class power amplifying circuits included in the D-class power amplifier of the two channels are constructed by opposite phases. A preprocess is performed only to low frequency components of input signals so that they have a substantially equal amplitude in the two channels, and the resultant low frequency components are supplied to the D-class power amplifying circuits, respectively. The other ends of loads connected to the D-class power amplifying circuits are connected to a neutral potential point of the power voltage.

4 Claims, 3 Drawing Sheets

D-CLASS POWER AMPLIFIER WITH ELECTRIC POWER REGENERATION FUNCTION

BACKGROUND OF THE INVENTION

1. Field of the Invention

The invention relates to a D-class power amplifier for use in an audio system.

2. Description of Related Art

In recent years, there is an increasing demand for miniaturization of an amplifier in an audio apparatus. Particularly, power amplifiers tend to have a large casing and a be heavy. This is because in the case of stereo systems called "mini-compo", miniaturization of the product is further required for pursuing a stylish design.

In response to the demand for miniaturization of the power amplifier, a power amplifier using what is called a D-class power amplification has become used popularly.

The D-class power amplification is an amplifying scheme that uses a modulating process such as pulse width modulation (PWM) or pulse density modulation (PDM) performed to a signal supplied to the power amplifier. The signal thus converted into a digital modulation signal, is thereafter amplified and the amplified signal is outputted as an analog signal via a low pass filter. In the case of the D-class power amplifying system, by the on/off-type driving of switching devices at a D-class switching stage before the low pass filter in accordance with the digital modulation signal formed based on the input signal, the signal is amplified so that an electric power efficiency of 100% can be obtained theoretically.

In a D-class power amplifying circuit which operates with positive and negative power supplies, a load current flowing in the low pass filter in the D-class power amplifying circuit and a connected load flows from both of the positive and negative power supplies irrespective of a positive/negative value of an output voltage. In other words, when the positive voltage is applied to the load, the circuit receives an electric power from the positive side power supply and operates so as to supply the electric power to the load and the negative side power supply. In this case, although the flowing direction of the electric power is the consuming direction of the electric power from the power supply to the load for the positive side power supply, it is the direction in which the electric power is regenerated from the load to the power supply for the negative side power supply.

A state where a regenerative current is caused due to the regeneration of the electric power in the D-class power amplifying circuit which operates by both of positive and negative power supplies is shown in FIG. 1.

First, in the diagram, it is assumed that a load current iL flows in a load RL in the direction shown by an arrow in the diagram. Switching devices S1 and S2 at a D-class switching stage in the D-class power amplifying circuit are alternately and repetitively turned on/off at a speed which is higher than a change in load current. That is, it is presumed that a switching frequency at the D-class switching stage is higher than the frequency of the load current.

Since the load current iL flows in an inductor L included in a low pass filter in the D-class power amplifying circuit (a capacitor constructing the low pass filter is omitted in the diagram), even if the on/off states of the switching devices S1 and S2 are switched by inertia of the inductor which obstructs the current change, the flowing direction is not changed in one period of the current iL. That is, as shown in a time chart in FIG. 1, it is possible to consider that the load current iL is time-divided into two currents, i1 flowing in a loop of a positive side power supply +Vcc and i2 flowing in a loop of a negative side power supply −Vcc, in correspondence to the switching of S1 and S2.

Now if we look carefully the directions of the currents i1 and i2, respectively, it will be understood that i1 flows in the direction in which an electric power is consumed from +Vcc, that is, the direction in which the current flows out of the power supply, while i2 flows in the direction in which an electric power is regenerated to −Vcc, that is, the direction in which the current flows into the power supply. A power supply capacitor C2 connected to the negative side power supply −Vcc is, thus, charged and a power voltage rises.

When the load current iL flows in the direction opposite to that in FIG. 1, a similar situation occurs with respect to the loop of the positive side power supply +Vcc, and the power voltage also rises likewise with respect to the positive side power supply.

A ratio of the increase in power voltage due to the regenerative current fluctuates depending on the frequency of the load current, that is, the frequency of the signal which is handled by the D-class power amplifying circuit. Generally, the lower the signal frequency is, the larger the increasing ratio of the power voltage. This is because since the lower the signal frequency is, the less frequently the load current is changed and the longer the time during which the current flows continuously in one direction is, the time during which the regenerative current i2 is integrated to the power supply capacitor C2 in FIG. 1 is also extended.

That is, the build up of power voltage due to the regenerative current becomes a problem, in particular when low frequency components of the signal are handled by the D-class power amplifying circuit. When the power voltage rises largely and exceeds withstanding voltage limits of devices in the D-class power amplifying circuit, then the concern will be the failure of devices in the D-class power amplifying circuit.

OBJECTS AND SUMMARY OF THE INVENTION

The invention is made to solve the drawbacks and it is an object of the invention to provide a D-class power amplifier in which an increase in power voltage due to a regenerative current is suppressed.

According to the invention, there is provided a D-class power amplifier for supplying an amplification signal obtained by amplifying two input signals to two loads which are mutually connected at one end of each load, comprising:

two D-class power amplifying circuits having output terminals connected to the other ends of the two loads, respectively;

a preprocessing circuit for performing a predetermined preprocess to the two input signals and supplying the processed signals to the two D-class power amplifying circuits; and a power supply circuit for supplying an electric power to the two D-class power amplifying circuits, wherein one of the two D-class power amplifying circuits executes an anti-phase power amplifying process and the other of the two-D-class power amplifying circuits executes an in-phase power amplifying process, the preprocessing circuit executes a process for equalizing amplitudes of two input signals in a low frequency band, and a node of the two loads is connected to a potentially neutral point of an output voltage from the power supply circuit.

DETAILED DESCRIPTION OF THE PREFERRED EMBODIMENT

Figure 2:
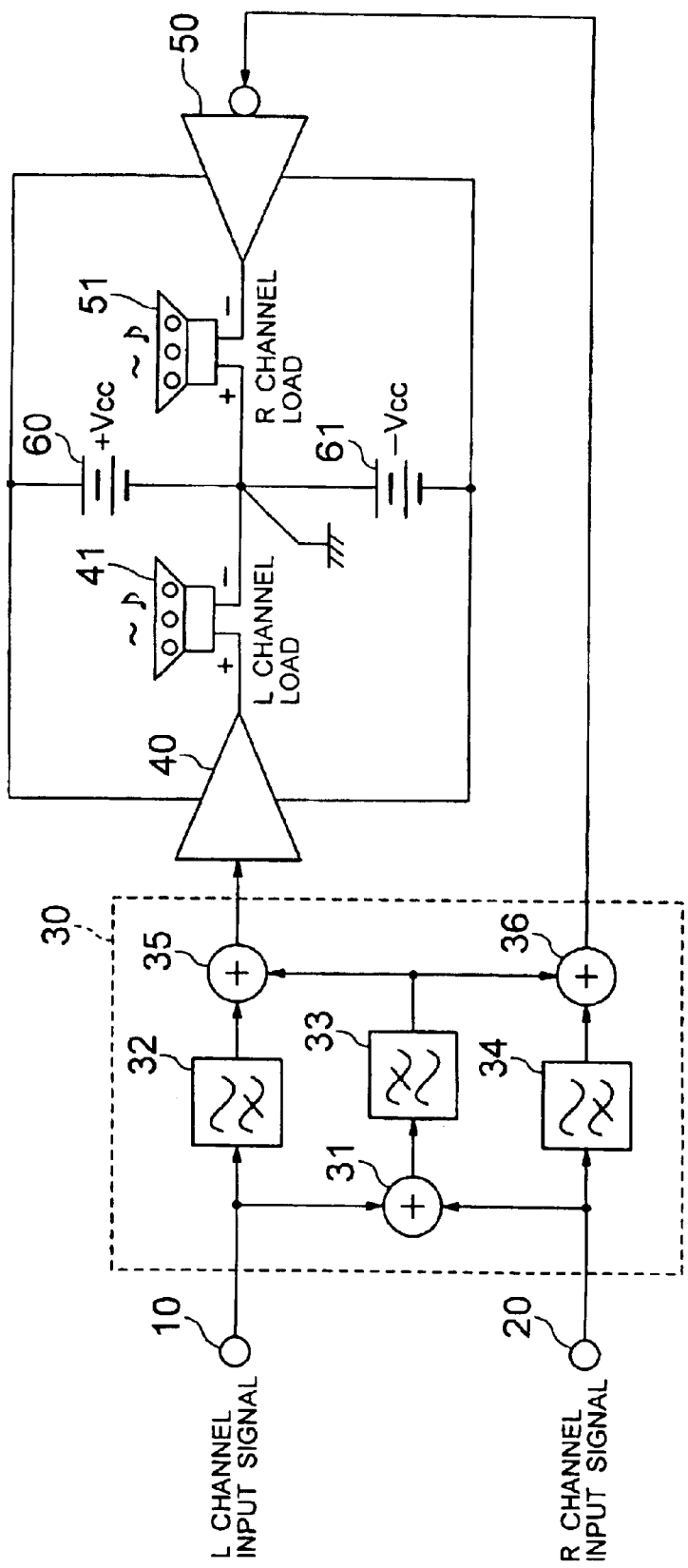
FIG. 2 is a block diagram showing the construction of a D-class power amplifier according to an embodiment of the invention.

FIG. 2 is a block diagram showing the construction of a D-class power amplifier according to an embodiment of the invention.

In FIG. 2, an L channel signal of stereophonic audio signals is supplied from an input terminal 10, while an R channel signal is likewise supplied from an input terminal 20.

A presignal processing circuit 30 is a circuit for performing a predetermined pre-signal process to those input signals and generating signals to be applied to a D-class power amplifying circuit at the post stage of the circuit. As shown in FIG. 2, the circuit comprises: high pass filters (hereinafter, simply abbreviated to HPF) 32 and 34 having a same cut-off frequency; a low pass filter (hereinafter, simply abbreviated to LPF) 33; and signal adding circuits 31, 35, and 36.

Each of those filters may be constituted by an analog filter, such as the so called LC filter an active filter and the like. It is also possible to realize the filter as a digital filter by a signal processing using what is called a digital processor (hereinafter, simply abbreviated to DSP). If the filter is constituted by the DSP, a DSP chip may be formed in such a way that whole pre-signal processing circuit 30 that additionally includes the signal adding circuits is constructed in the DSP chip.

Although D-class power amplifying circuits 40 and 50 are D-class power amplifying circuits for the L channel and the R channel, respectively, and have the same amplifying function, phases of output signals of those circuits are opposite. Each of the D-class power amplifying circuits 40 and 50 includes a low pass filter to remove a D-class switching signal and its harmonic components at an output stage thereof.

Speakers 41 and 51 are loads of the D-class power amplifying circuits 40 and 50, and convert electric signals from the L channel and the R channel into acoustic signals to be output, respectively. As mentioned above, the phase of the output signal of the D-class power amplifying circuit 40 for the L channel and that of the D-class power amplifying circuit 50 for the R channel are opposite. Therefore, the speaker 41 for the L channel and the speaker 51 for the R channel are connected to the D-class power amplifying Circuits in such a way that polarities of the speakers are opposite as shown in FIG. 2, so that the reversed phase relation does not exist in the reproduced sounds in the form of acoustic signals. That is, the connection of the speakers is such that when signals of the same polarity are applied from the D-class power amplifying circuits, directions of movements of the diaphragms of the speakers are opposite to each other. is such that when signals of the same polarity are applied from the D-class power amplifying circuits, directions of movements of the diaphragms of the speakers are opposite to each other.

A positive side power supply 60 and a negative side power supply 61 are power supply circuits for supplying an electric power for allowing the D-class power amplifying circuits 40 and 50 to drive the speakers 41 and 51 as loads, respectively. As those power supplies, it is possible to use power supplies of a generally used type that rectifies a step-down AC output from a transformer to obtain a DC current, or power supplies of the so called switching power supply having a high power efficiency.

With regard to the embodiment shown in FIG. 2, the operation in the presignal processing circuit 30 will be described first.

High frequency components included in the signals supplied from the input terminal 10 of the L channel and the input terminal 20 of the R channel are extracted for each channel by the HPFs 32 and 34. At the same time, the input signals from both channels are added by the signal adding circuit 31, and low frequency components included in the signal of the (L+R) channels are extracted by the LPF 33.

The high frequency components included in the input signals of the L channel and the R channel and the low frequency components included in the signal of the (L+R) channels are added together in each channel by the signal adding circuit 35 or 36 and an addition signal constitutes an output signal of each channel of the presignal processing circuit 30.

That is, when the low frequency components included in the input signals of the L channel and the R channel are assumed to be Linlo and Rinlo and the high frequency components included in those input signals are assumed to be Linhi and Rinhi, respectively, output signals Lout and Rout of both channels from the presignal processing circuit 30 can be expressed as follows.

Lout=Linlo+Linhi+Rinlo=(Linlo+Rinlo)+Linhi

Rout=Rinlo+Rinhi+Linlo=(Linlo+Rinlo)+Rinhi

It is understood that the low frequency components of the signals of both channels included in the output signals of both channels from the presignal processing circuit 30 are identical with each other as indicated by the terms in the parenthesis in the above equations.

In the embodiment shown in FIG. 2, all of cut-off frequencies of the HPFs 32 and 34 and the LPF 33 are substantially equal and set to a frequency near about 70 Hz. The low frequency components in the process of the presignal processing circuit 30 indicate a signal in a frequency band of a frequency near about 70 Hz or lower, while the high frequency components indicate a signal in a frequency band of a frequency near about 70 Hz or higher. That is, the input signals from the L channel and the R channel pass through the presignal processing circuit 30, so that the frequency components of the signals in the frequency band of a frequency near about 70 Hz or lower are substantially equal. That is, this means that amplitudes of the signals in that frequency band are substantially equal.

In the reproduction of stereophonic audio signals, if the signals of the L channel and the R channel are made the same, deterioration of a channel separation between both channels is caused, so that there can be a case that an inconvenience occurs in the reproduction of the audio signals. It is known, however, that the lower a reproducing frequency is, the wider directivity of the speakers becomes. In other words, it becomes difficult to recognize the position of a sound source. Further, as will be also obvious from a loudness-level contour expressing an audible level range in the human auditory sense, it is known that the lowest value of the audible range remarkably rises, for example, for frequencies near about 70 Hz or lower. That is, even if a process that decreases the channel separation is executed in the frequency band of the frequencies near about 70 Hz or lower like in the described embodiment, the possibility is very low that any change is audible to the user's auditory sense upon reproduction of the signals.

The description will be made for the operation of the D-class power amplifying circuit in the block diagram shown in FIG. 2 with reference to a structural diagram of FIG. 3.

Figure 3:
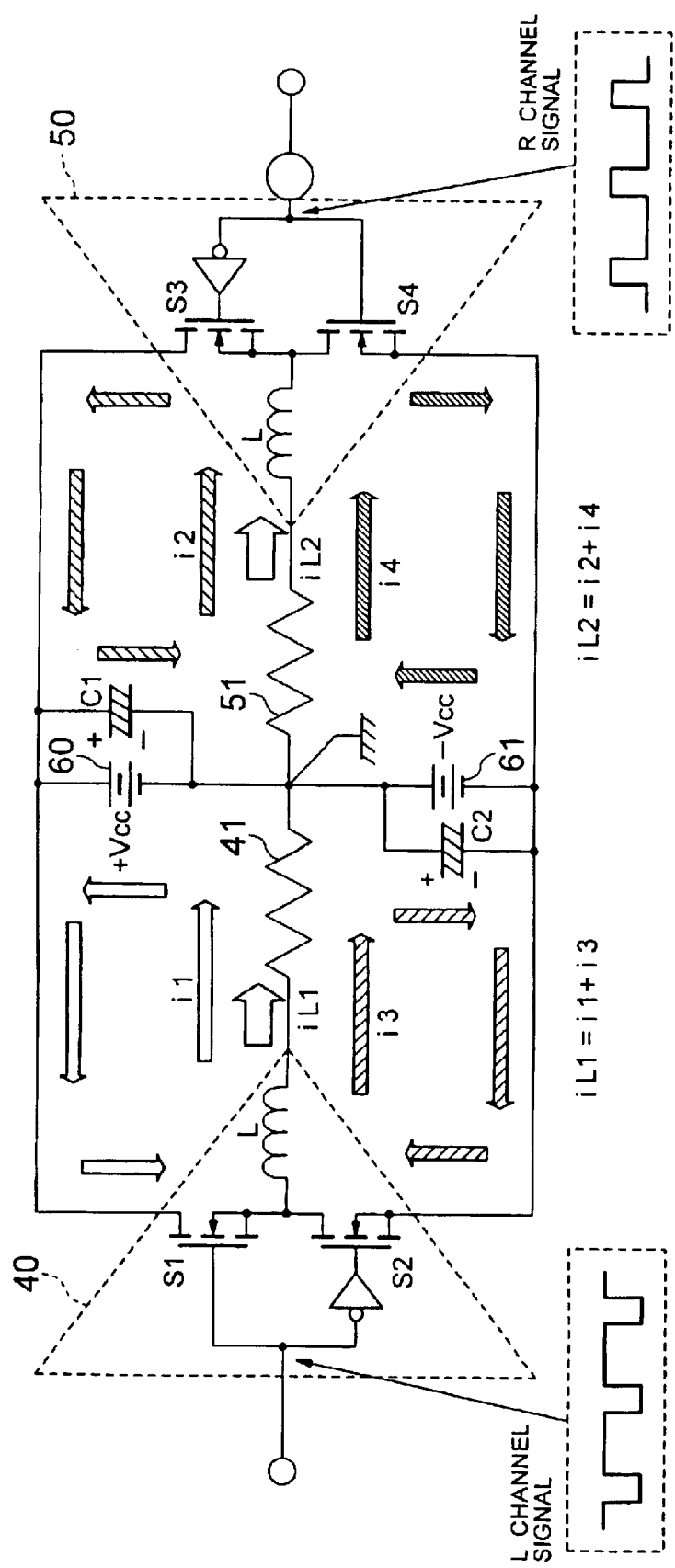
FIG. 3 is an explanatory diagram showing the operation of D-class power amplifying circuit portions in the apparatus in FIG. 2.

FIG. 3 is a schematic diagram showing the portions of the D-class power amplifying circuits, loads, and power supply circuits in the block diagram shown in FIG. 2 for the purpose of making the explanation of the operation easy.

In the diagram, since it is necessary to clearly explain the operation, the D-class power amplifying circuit 40 is schematically illustrated only by the switching devices S1 and S2 at the D-class switching stage and the inductor L of the built-in LPF. Similarly, the D-class power amplifying circuit 50 is also schematically illustrated only by S3, S4, and L. S1 to S4 are constructed by active switching devices such as transistors or FETs. An inductor formed by winding a coil around an air-core bobbin, a bobbin with a core, or a toroidal core is generally used as L.

The speakers 41 and 51 as connection loads of the D-class power amplifying circuits are simply expressed as load resistors and the existence of power supply capacitors C1 and C2 are clearly illustrated in both of the positive side power supply 60 and negative side power supply 61, respectively.

In the circuits shown in FIG. 3, a load current iL1 to the load 41 and a load current iL2 to the load 51 are supplied from the two D-class power amplifying circuits 40 and 50 which operate at the opposite phases.

Figure 1:
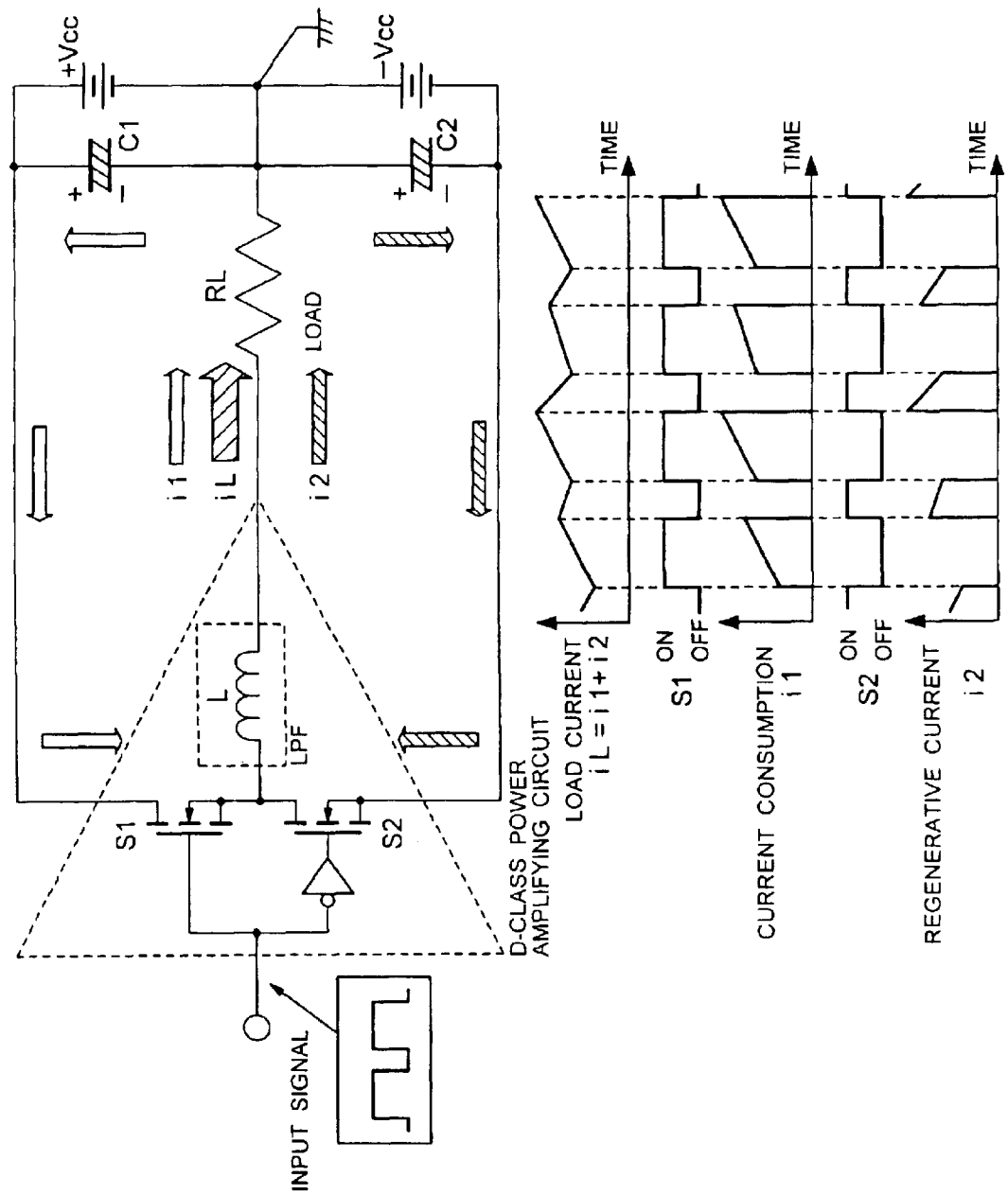
FIG. 1 is an explanatory diagram showing a principle of an increase in power voltage in a D-class power amplifying circuit which is driven by both of positive and negative power supplies.

In the case, as described in the circuit of FIG. 1 mentioned above, it is possible to consider that the load current iL1 from the D-class power amplifying circuit 40 is time-divided into the consumption current i1 to which an electric power is supplied from the positive side power supply +Vcc and a regenerative current i3 which regenerates an electric power to the negative side power supply −Vcc and flow. Similarly, the load current iL2 from the D-class power amplifying circuit 50 can be also time-divided into a consumption current i4 to which an electric power is supplied from the negative side power supply −Vcc and the regenerative current i2 which regenerates an electric power to the positive side power supply +Vcc.

The signals which are supplied to the D-class power amplifying circuits 40 and 50 are processed by the presignal processing circuit 30, so that the frequency components near about 70 Hz or lower in the L channel and those in the R channel are the same. That is, in the frequency band described above, magnitudes of the load currents iL1 and iL2 are substantially equal. Since the D-class power amplifying circuits 40 and 50 operate at the opposite phases, the phases of iL1 and iL2 are also opposite. In the circuits of FIG. 3, therefore, with respect to the signals of the frequency band of frequencies near about 70 Hz or lower, magnitude of the consumption current i1 of the positive side power supply and that of the consumption current i4 of the negative side power supply are substantially equal. The current i4 is stopped for a period of time during which the current i1 flows. The current i1 is stopped for a period of time during which the current i4 flows.

As described in FIG. 1, the timings when the consumption currents and the regenerative currents to/from both of the positive and negative power supplies are determined by switching timings in a combination of the switching devices S1 and S2 or S3 and 54. That is, when the consumption current i1 flows, the regenerative current i3 is stopped. When the consumption current i4 flows, the regenerative current i2 is stopped.

When the above-described timings at which the currents flow will now be summarized, the consumption current i1 and the regenerative current i2 flow simultaneously to the positive side power supply +Vcc, and the consumption current i4 and the regenerative current i3 flow simultaneously to the negative side power supply −Vcc. Since a value of the regenerative current is always smaller than that of the consumption current due to the law of conservation of energy, relations of i1>i3 and i4>i2 are always satisfied in the circuits of FIG. 3. There is a predetermined relation between the values of the consumption currents and the values of the regenerative currents. In FIG. 3, if the consumption currents are set to i1=i4, since the constructions of the D-class power amplifying circuits of both of the R and L channels are symmetrical, the regenerative currents are also set to i2=i3. From the above explanation, the relations of i1>i2 and i4>i3 are satisfied in the circuits of FIG. 3.

That is, in the circuits of FIG. 3, at the timing when the consumption current i1 and the regenerative current i2 flow simultaneously, the whole regenerative current i2 on the R channel side is consumed as a consumption current i1 on the L channel side, and no electric power is regenerated to the positive side power supply +Vcc. The capacitor C1 of the positive side power supply unit, therefore, is not charged by the regenerative current i2 and the value of the positive side power supply +Vcc does not rise.

Since the relation of i1>i2 is satisfied as mentioned above, the consumption current which is supplied from the positive side power supply +Vcc to the load 41 is only the difference (i1-i2) which could not be supplemented by the regenerative current i2. The consumption current from the power supply, therefore, can be remarkably reduced as compared with the conventional system such that the whole consumption current i1 on the L channel side is supplied from the positive side power supply +Vcc. In association with it, a small capacity and a miniaturization of the power supply unit can be also realized.

The timing when the consumption current i4 and the regenerative current i3 flow simultaneously is also specified in a manner similar to the case of i1 and i2 mentioned above. That is, the whole regenerative current i3 on the L channel side is consumed as a consumption current i4 on the R channel side, no electric power is regenerated to the negative side power supply −Vcc, and the voltage of the negative side power supply does not rise. The current which is supplied from the negative side power supply −Vcc to the load 51 is also only the difference between the consumption current i4 and the regenerative current i3, and the electric power consumption can be reduced.

According to the present invention, the selection of the timing when the consumption current and the regenerative current flow is not limited to that in the case where i1 and i2 (or i3 and i4) flow simultaneously as in the embodiment described above. It is sufficient that a ratio of the times during which i1 and i3 flow, that is, a ratio of on/off times of S1 and S2 is equal to a ratio of the times during which i2 and i4 flow, that is, a ratio of on/off times of S3 and S4.

That is, it is not always necessary that i1 and i2 (or i3 and i4) flow simultaneously. So long as time ratios of the switching operations of the two circuits are equal, any problems hardly occur since the consumption and regeneration of the electric power are executed at a high speed while a good balance is maintained between them.

In the embodiment described above, the preprocess for equalizing the amplitudes of the L channel signal and the R channel signal has been executed with respect to only the low frequency components of the input signals of both channels because it is necessary to prevent any change to the auditory sense in association with the deterioration of the channel separation.

Specifically speaking, in the embodiment, the cut-off frequencies of the HPFs and LPF included in the presignal processing circuit 30 are set to frequencies near about 70 Hz. With respect to the signals in the frequency band of the frequencies near about 70 Hz or lower, therefore, the amplitude equalizing process of both of the channel signals is validated, however, the process does not act effectively with respect to the signals in a frequency band of the frequencies above 70 Hz.

With respect to the signals in the frequency band of the frequencies near about 70 Hz or higher, therefore, the signals which are supplied to the D-class power amplifying circuits become the input signals which are inherent to both channels and, naturally, those signals have different amplitudes and phases every channel. That is, with respect to the signals in the frequency band of the frequencies near about 70 Hz or higher, the amplitude relation or phase relation regarding the consumption currents and the regenerative currents of both channels as described above in FIG. 3 are not satisfied. The set-off of the consumption current and the regenerative current does not function effectively.

The increase in power voltage due to the regenerative current, however, changes depending on the frequency of the input signal as mentioned above. When the signal frequency rises, an increase value of the power voltage suddenly decreases. As shown in the embodiment, therefore, even if the amplitude equalizing process of both channel signals is executed only to the low frequency signal near about 70 Hz or lower, the increase in power voltage due to the regenerative current can be suppressed to about 1/18 of that in the case where the above process is not performed.

An upper limit value of the signal frequency at which the amplitude equalizing process of both channel signals is executed is not limited to 70 Hz as a value shown in the embodiment but various values can be selected in consideration of two conditions of the deterioration of the channel separation and the increase permission value of the power voltage.

Since the power amplifier according to the invention has the construction such that the regenerative currents of both circuits are mutually set off in the two D-class power amplifying circuits, the increase in power voltage due to the regenerative current can be prevented.

Since the apparatus has a form such that the two D-class power amplifying circuits mutually set off the regenerative currents, an effect such that the efficiency does not deteriorate as compared with that in the conventional construction in which the regenerative currents are consumed as a heat is obtained. Further, since the two D-class power amplifying circuits drive the loads by the opposite phases, an effect such that using efficiency of the power voltage rises is also derived.

This application is based on Japanese Patent Application No. 2001-147851 which is herein incorporated by reference.

What is claimed is:

1. A D-class power amplifier for supplying an amplification signal obtained by amplifying two input signals to two loads which are mutually connected at one end of each load, comprising:

two D-class power amplifying circuits having output terminals connected to the other ends of said two loads, respectively;

a preprocessing circuit for performing a predetermined preprocess to said two input signals and supplying the processed signals to said two D-class power amplifying circuits; and a power supply circuit for supplying an electric power to said two D-class power amplifying circuits, wherein one of said two D-class power amplifying circuits executes an anti-phase power amplifying process and the other of said two D-class power amplifying circuits executes an in-phase power amplifying process, said preprocessing circuit executes a process for equalizing amplitudes of the two input signals in a low frequency band, and a node of said two loads is connected to a neutral potential point of an output voltage from said power supply circuit.

2. The D-class power amplifier according to claim 1, wherein said preprocessing circuit comprises:

two high pass filters for extracting high frequency components included in said two input signals of two channels respectively;

a first signal adding circuit for adding said two input signals of said two channels;

a low pass filter which has a same cut-off frequency as that of said two high pass filters and extracts low frequency components included in an output of said first signal adding circuit; and two second signal adding circuits for adding an output of said low pass filter to each of outputs of said two high pass filters of said two channels respectively, and wherein each output from said two second signal adding circuits is supplied to each of said two D-class power amplifying circuits.

3. The D-class power amplifier according to claim 1, wherein said power supply circuit has output voltages of positive and negative polarities, and the neutral potential point of said output voltages is a grounding potential.

4. The D-class power amplifier according to claim 2, wherein said power supply circuit has output voltages of positive and negative polarities, and the neutral potential point of said output voltages is a grounding potential.

* * * * *